(12) United States Patent
Saiki

(10) Patent No.: US 7,098,110 B2
(45) Date of Patent: Aug. 29, 2006

(54) SEMICONDUCTOR DEVICE AND METHOD OF MANUFACTURING THEREOF

(75) Inventor: Takashi Saiki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/352,928

(22) Filed: Jan. 29, 2003

(65) Prior Publication Data
US 2003/0227054 A1    Dec. 11, 2003

(30) Foreign Application Priority Data
Jun. 7, 2002    (JP) .............................. 2002-167637

(51) Int. Cl.
*H01L 21/336* (2006.01)
(52) U.S. Cl. ...................... 438/301; 438/303
(58) Field of Classification Search ................ 438/305, 438/769, 765–767, 197, 294, 299, 301, 303
See application file for complete search history.

(56) References Cited

U.S. PATENT DOCUMENTS

| | | | | |
|---|---|---|---|---|
| 4,744,859 A | * | 5/1988 | Hu et al. ..................... | 438/303 |
| 5,923,969 A | * | 7/1999 | Oyamatsu ..................... | 438/183 |
| 5,933,721 A | * | 8/1999 | Hause et al. ................. | 438/217 |
| 6,051,471 A | * | 4/2000 | Gardner et al. .............. | 438/286 |
| 6,144,071 A | * | 11/2000 | Gardner et al. .............. | 257/344 |
| 6,153,476 A | * | 11/2000 | Inaba et al. ................. | 438/275 |
| 6,294,797 B1 | * | 9/2001 | Wu .............................. | 257/67 |
| 6,335,252 B1 | * | 1/2002 | Oishi et al. .................. | 438/303 |
| 6,399,453 B1 | * | 6/2002 | Nagai et al. ................. | 438/305 |
| 2001/0054725 A1 | * | 12/2001 | Nagai et al. ................. | 257/288 |

* cited by examiner

*Primary Examiner*—Scott B. Geyer
(74) *Attorney, Agent, or Firm*—Westerman, Hattori, Daniels & Adrian, LLP.

(57) ABSTRACT

A silicon nitride film having a thickness of 3 nm or less is formed on the surfaces of a P-well and N-well, as well as on the upper and side surfaces of a gate electrode, in which the silicon nitride film can be formed, for example, by exposing the surface of the P-well and N-well, and the upper and side surfaces of the gate electrode to a nitrogen-gas-containing plasma using a magnetron RIE apparatus. Then, pocket layers, extension layers and source/drain layers are formed while leaving the silicon nitride film unremoved.

17 Claims, 17 Drawing Sheets

NMOS    PMOS

NMOS    PMOS

NMOS    PMOS

SEMICONDUCTOR DEVICE AND METHOD OF MANUFACTURING THEREOF

CROSS-REFERENCE TO RELATED APPLICATIONS

This application is based upon and claims the benefit of priority from the prior Japanese Patent Application No. 2002-167637, filed on Jun. 7, 2002, the entire contents of which are incorporated herein by reference.

BACKGROUND OF THE INVENTION

1. Field of the Invention

The present invention relates to a semiconductor device suitable for composing CMOS (complementary metal-oxide semiconductor) and a method of manufacturing thereof.

2. Description of the Related Art

General procedures for manufacturing conventional CMOS transistor are as follows. FIGS. 15A through 17C are schematic sectional views serially showing process steps of a conventional method of manufacturing a CMOS transistor.

First as shown in FIG. 15A, an element isolation region 4 is formed in the surficial portion of a P-type semiconductor substrate 1, and wells are then formed in the device forming areas partitioned by the element isolation region 4, where a P-well 2 is formed in an N-channel MOS (NMOS) area, and an N-well 3 is formed in a P-channel MOS (PMOS) area.

Next as shown in FIG. 15B, an insulating film and a polysilicon film are formed on the semiconductor substrate 1, and then patterned to thereby form gate insulating films 5 and gate electrodes 6, respectively, in the device forming areas.

Next as shown in FIG. 15C, a resist film 21 is formed so as to cover the PMOS area and to expose the NMOS area. Using the resist film 21 and gate electrode 6 together as a mask, arsenic is ion-implanted at a high concentration to thereby form extension layers 11 in the P-well 2, and then boron or indium is ion-implanted to thereby form pocket layers 9 deeper in the P-well 2. Ion implantation of boron or indium herein is carried out from a direction normal to or declined away from the surface of the semiconductor substrate 1.

Next as shown in FIG. 16A, the resist film 21 is removed, and a resist film 22 is formed so as to cover the NMOS area and to expose the PMOS area. Using the resist film 22 and gate electrode 6 together as a mask, boron is ion-implanted at a high concentration to thereby form extension layers 12 in the N-well 3, and then arsenic is ion-implanted to thereby form pocket layers 10 deeper in the N-well 3. Ion implantation of arsenic herein is carried out from a direction normal to or declined away from the surface of the semiconductor substrate 1.

Next as shown in FIG. 16B, the resist film 22 is removed, an insulating film is formed over the entire surface, and the film is then anisotropically etched so as to leave a portion of such film only on the side surfaces of the gate electrodes 6, to thereby form side walls 13.

Next as shown in FIG. 16C, a resist film 25 is formed on the semiconductor substrate 1 so as to cover the PMOS area and to expose the NMOS area. Using the resist film 25, gate electrode 6 and side walls 13 together as a mask, arsenic is ion-implanted at a high concentration to thereby form deep source/drain diffusion regions 14.

Next as shown in FIG. 17A, the resist film 25 is removed, and a resist film 26 is formed on the semiconductor substrate 1 so as to cover the NMOS area and to expose the PMOS area. Using the resist film 26, gate electrode 6 and side walls 13 together as a mask, boron is ion-implanted at a high concentration to thereby form deep source/drain diffusion regions 15.

Then as shown in FIG. 17B, the resist film 26 is removed, and a silicide layer, which is typically a cobalt silicide layer 16, is then formed on the gate electrodes 6 and source/drain diffusion regions 14 and 15.

This process successfully yields a CMOS transistor.

The foregoing process however suffers from a drawback such that the resist films 21, 22 used as the masks when the pocket layers and extension layers are formed must be removed after these layers are formed, where ashing or wet treatment required for removing the resist films 21, 22 inevitably oxidizes the silicon substrate. Oxidation of the silicon substrate results in loss of the implanted impurities, which fails in attaining an expected concentration and profile. Oxidation of the silicon substrate is also disadvantageous in that making the extension layers distant from the gate portion to thereby substantially deepen junction of the extension layers. This undesirably causes degradation of the characteristics, which is typified by short-channel effect.

Another disadvantage of the above-described manufacturing method relates to annealing which is necessary for activating impurities in the source/drain region 15 after the formation thereof, where the annealing undesirably promotes outward diffusion of impurities which reside in the channel to thereby cause depletion of the channel, or undesirably promotes outward diffusion of impurities which reside in the source/drain diffusion region 15.

There is known a technique for suppressing the outward diffusion, which is an oxide film capping based on RTO (rapid thermal oxidation). Another known technique relates to formation of an outward diffusion preventive film, which is typified by a nitride film having a thickness of 100 nm or around formed by CVD process. The oxide film capping, however, suffers from a drawback such that profile of the source/drain diffusion layer becomes deeper due to accelerated diffusion induced by oxygen. On the other hand, formation of the nitride film having a thickness of 100 nm or around on the side surfaces of the gate electrode by the CVD process tends to result in increased stress and abnormal diffusion.

SUMMARY OF THE INVENTION

In consideration of the foregoing problems, it is therefore an object of the present invention to provide a semiconductor device and a method of manufacturing thereof, which are aimed at achieving excellent characteristics, such as low extension resistivity, by preventing oxidation of the semiconductor substrate possibly proceeds during removal of the resist film, and by preventing outward diffusion of the impurities during annealing.

After extensive investigations, the present inventors reached the several aspects of the invention described below.

A method of manufacturing a semiconductor device according to one aspect of the present invention characteristically comprises a step for forming on a semiconductor substrate having a first conductivity type a gate insulating film which comprises a material having a dielectric constant higher than that of silicon oxide film; a step for forming a gate electrode on the gate insulating film; a step for introducing nitrogen into the surface of the semiconductor substrate and the gate electrode; and a step for forming a pair of impurity layers having the opposite conductivity type from the first conductivity type, which are formed in the semiconductor substrate so as to fall on both sides of the gate electrode.

In the present invention, formation of the gate insulating film and gate electrode is followed by introduction of nitrogen into the surfaces of the semiconductor substrate and gate electrode, so that the areas introduced with nitrogen are successfully prevented from being oxidized even the resist film is formed and then removed thereon. The present invention is also advantageous in that the annealing is carried out in such a state that the surfaces of the semiconductor substrate and gate electrode are introduced with nitrogen, which successfully prevents outward diffusion of impurities already contained therein.

The present invention is thus successful in preventing depletion of the channel, which has been a problem in the conventional process, and as a consequence in obtaining a semiconductor device having excellent characteristics.

BRIEF DESCRIPTION OF THE DRAWINGS

The above and other features will be better understood from the exemplary embodiments described below, taken together with the drawings, of which.

DETAILED DESCRIPTION OF THE PREFERRED EMBODIMENTS

The semiconductor device and the method of manufacturing thereof according to embodiments of the present invention will specifically be described below. FIGS. 1A through 5C are schematic sectional views serially showing the process steps of the method of manufacturing a semiconductor device according to the first embodiment of the present invention.

Figure 1A:
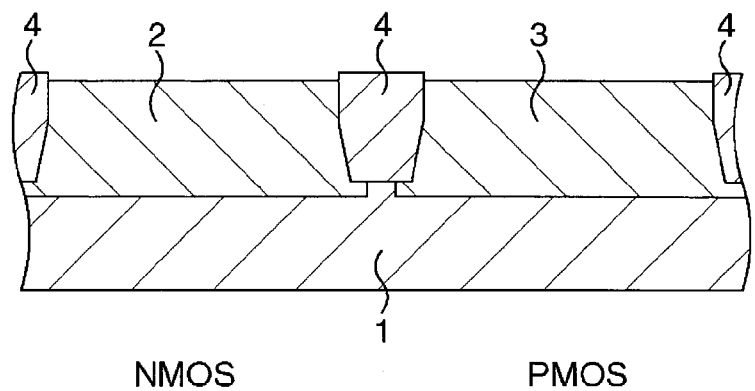
FIGS. 1A through 1C are schematic sectional views serially showing process steps of a method of manufacturing a semiconductor device according to a first embodiment of the present invention.

In the first embodiment, an element isolation region 4 is formed in the surficial portion of a P-type semiconductor substrate 1 as shown in FIG. 1A, and wells are then formed in the device forming areas partitioned by the element isolation region 4, where a P-well (channel) 2 is formed in an N-channel MOS (NMOS) area, and an N-well (channel) 3 is formed in a P-channel MOS (PMOS) area.

Figure 1B:
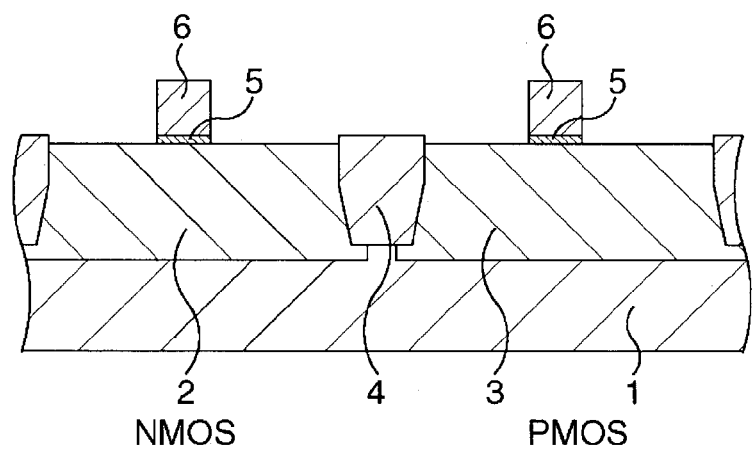

Next as shown in FIG. 1B, an insulating film and a polysilicon film are formed on the semiconductor substrate 1, and then patterned to thereby form gate insulating films 5 and gate electrodes 6, respectively, in the device forming areas. The gate insulating film 5 is preferably composed of a silicon oxinitride film, where a silicon oxide film is also allowable.

Figure 1C:
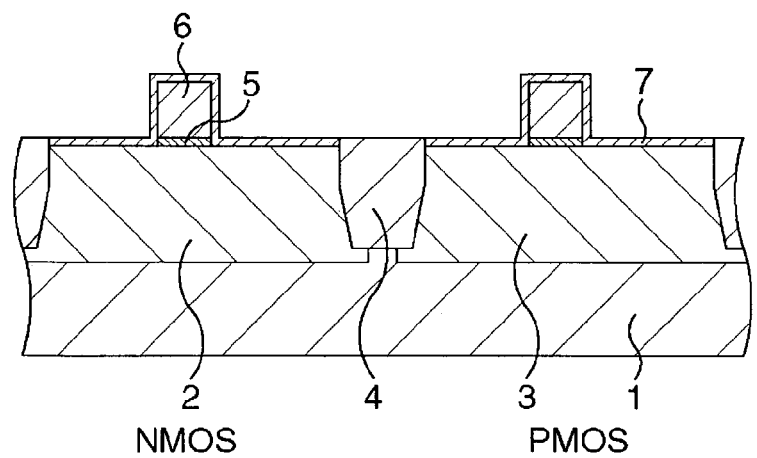

Next as shown in FIG. 1C, a silicon nitride film (nitrogen-introduced layer) 7 having a thickness of 3 nm or less is formed on the surface of a P-well 2 and N-well 3, and on the upper and side surfaces of a gate electrode 6. The silicon nitride film 7 can be formed typically by exposing the surfaces of the P-well 2 and N-well 3, and the upper and side surfaces of the gate electrode 6 to a nitrogen-gas-containing plasma using a magnetron RIE apparatus. Typical conditions for the exposure involves a gas pressure of 10 mTorr (approx. $1.33 \times 10^{-1}$ Pa), an RF power of 100 W, an $N_2$ flow rate of 50 sccm, a process time of 2 seconds, and a process temperature of 15° C. It is also allowable to form the silicon nitride film 7 by exposing the surfaces of the P-well 2 and N-well 3, and the upper and side surfaces of the gate electrode 6 to a plasma of a mixed gas of nitrogen and argon using a magnetron RIE apparatus. Still another method of forming the silicon nitride film 7 can be such that exposing the surfaces of the P-well 2 and N-well 3, and the upper and side surfaces of the gate electrode 6 to radicals generated from a nitrogen-containing gas (e.g., a mixed gas of nitrogen and helium) using a remote-plasma apparatus. Typical conditions for the exposure involves a process temperature of 550 to 800° C., a process time of 30 to 60 seconds, a power of 3 kW, and a mixing ratio of nitrogen and helium of 10:90 in percentage by volume.

Figure 2A:
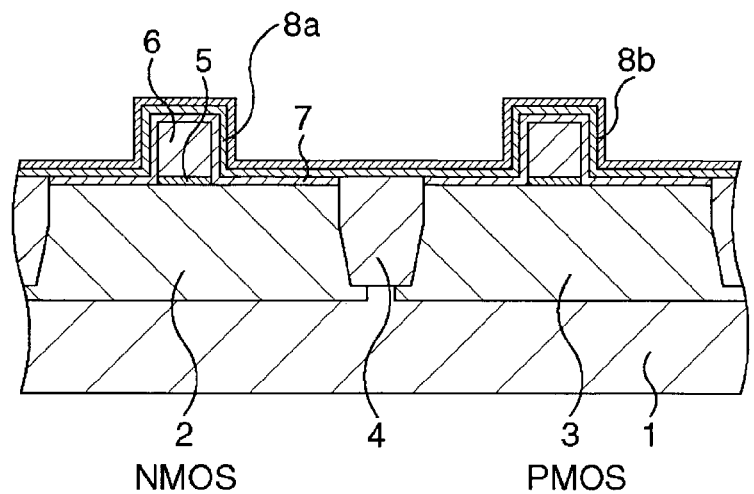
FIGS. 2A through 2C are schematic sectional views, as continued from FIG. 1C, serially showing process steps of the method of manufacturing the semiconductor device according to the first embodiment of the present invention.

Next as shown in FIG. 2A, a silicon oxide film 8a and a silicon nitride film 8b are successively formed over the entire surface.

Figure 2B:
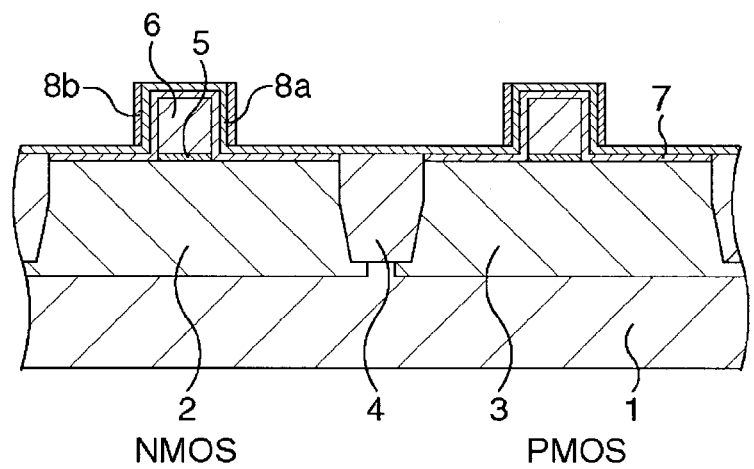

Next as shown in FIG. 2B, the silicon nitride film 8b is anisotropically etched to thereby leave the film only on the side portions of the gate electrode 6.

Figure 2C:
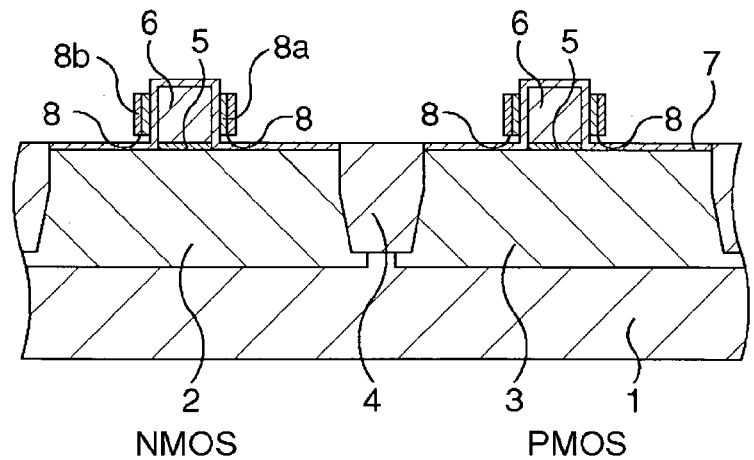

The silicon oxide film 8a is then subjected to wet processing. The process results in removal of the lower end portions of the stacked film which is composed of the silicon oxide film 8a and silicon nitride film 8b, to thereby form notches 8 thereat as shown in FIG. 2C.

Figure 3A:
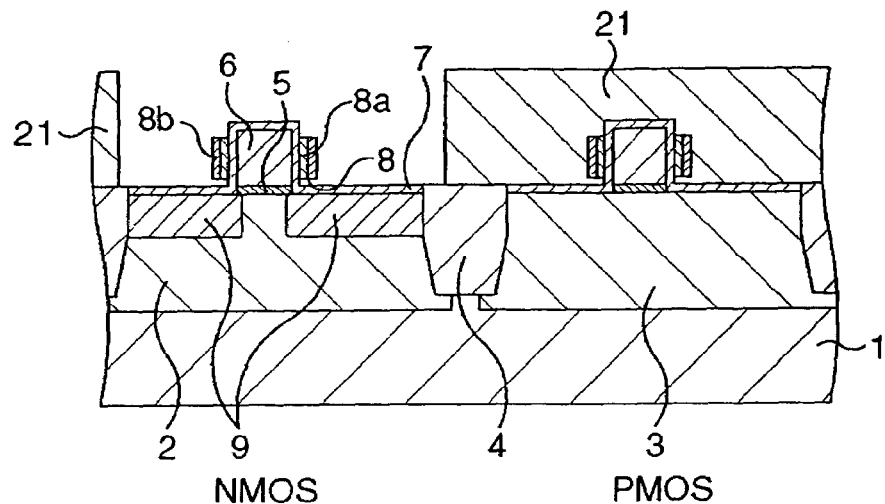
FIGS. 3A through 3C are schematic sectional views, as continued from FIG. 2C, serially showing process steps of the method of manufacturing the semiconductor device according to the first embodiment of the present invention.

Next as shown in FIG. 3A, a resist film 21 is formed on the semiconductor substrate 1 so as to cover the PMOS area and to expose the NMOS area. Using the resist film 21 and gate electrode 6 together as a mask, P-type impurities, which are typically indium and boron, are ion-implanted to thereby form P-type pocket layers 9 in the surficial portions of the P-well 2. The ion implantation is typically carried out by inclined ion implantation from four directions orthogonal to each other in a plan view. As for the ion implantation of indium, an implantation energy is typically set to 60 to 90 keV and an amount of dose is set to $5 \times 10^{12}$ to $1.1 \times 10^{13}$ cm$^{-2}$. As for the ion implantation of boron, an implantation energy is typically set to 8 to 12 keV and an amount of dose is set to $2 \times 10^{12}$ to $7 \times 10^{12}$ cm$^{-2}$. The resist film 21 is removed after the ion implantation, and then annealing is carried out so as to activate the implanted impurities. It is also allowable to carry out the annealing by spike annealing under an $N_2$ atmosphere at 950 to 1,050° C. The removal of the resist film 21 can be accomplished by ashing or wet processing. Typical conditions for the ashing relate to use of a down-flow apparatus, an $O_2$ flow rate of 1,000 sccm, a $CF_4$ flow rate of 10 sccm, a flow rate of a forcing gas of 600 sccm, and a process temperature of 250° C. The wet processing can typically be accomplished by using a sulfuric acid-hydrogen peroxide mixed solution. Any other resist films described hereinafter can be removed in a similar manner.

Figure 3B:
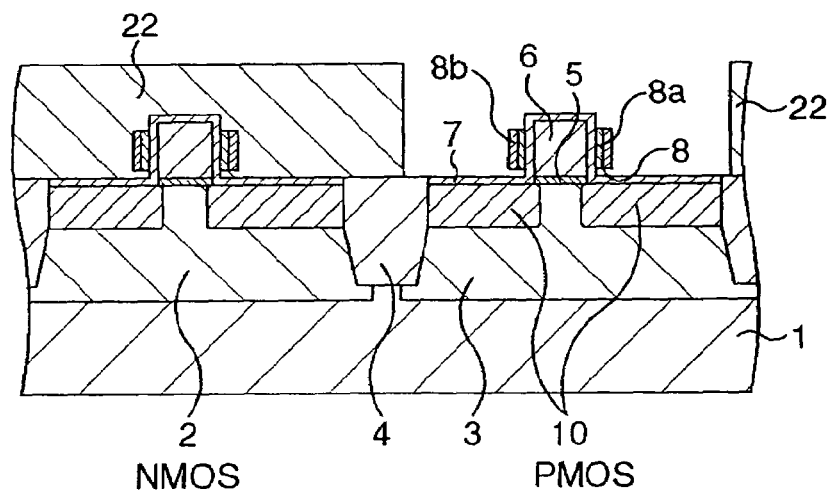

Then as shown in FIG. 3B, a resist film 22 is formed on the semiconductor substrate 1 so as to cover the NMOS area and to expose the PMOS area. Using the resist film 22 and gate electrode 6 together as a mask, an N-type impurity, which is typically antimony, is ion-implanted to thereby form N-type pocket layers 10 in the surficial portions of the N-well 3. The ion implantation is typically carried out by inclined ion implantation from four directions orthogonal to each other in a plan view, where an implantation energy is typically set to 50 to 70 keV and an amount of dose is set to $1.0 \times 10^{13}$ to $1.5 \times 10^{13}$ cm$^{-2}$. The resist film 22 is removed after the ion implantation.

Figure 3C:
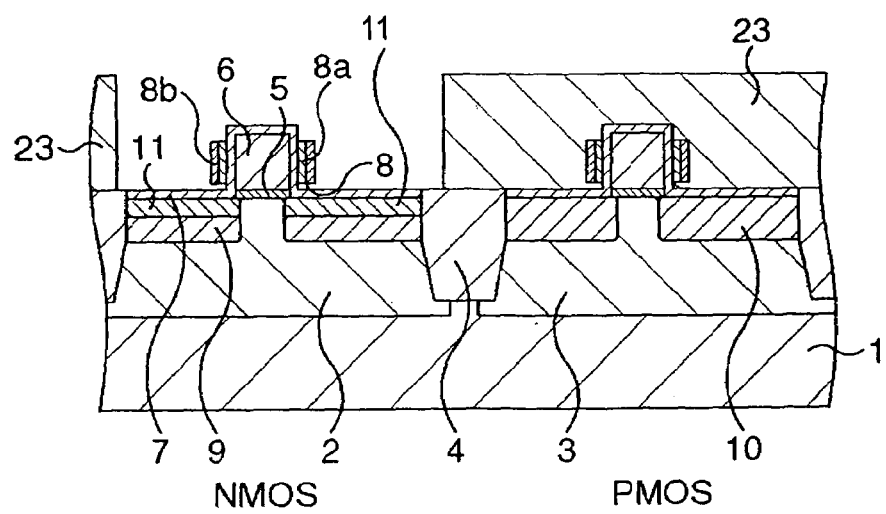

Next as shown in FIG. 3C, a resist film 23 is formed on the semiconductor substrate 1 so as to cover the PMOS area and to expose the NMOS area. Using the resist film 23, gate electrode 6, silicon oxide film 8a and silicon nitride film 8b together as a mask, an N-type impurity, which is typically arsenic, is ion-implanted to thereby form N-type extension layers 11 in the surficial portions of the pocket layers 9. The ion implantation is effected typically from the direction normal to the surface of the semiconductor substrate 1, where an implantation energy is typically set to 2 to 4 keV and an amount of dose is set to $1.0 \times 10^{15}$ to $1.5 \times 10^{15}$ cm$^{-2}$. The resist film 23 is removed after the ion implantation, and then annealing is carried out so as to activate the implanted impurity. It is also allowable to carry out the annealing by spike annealing under an $N_2$ atmosphere at 950 to 1,050° C.

Figure 4A:
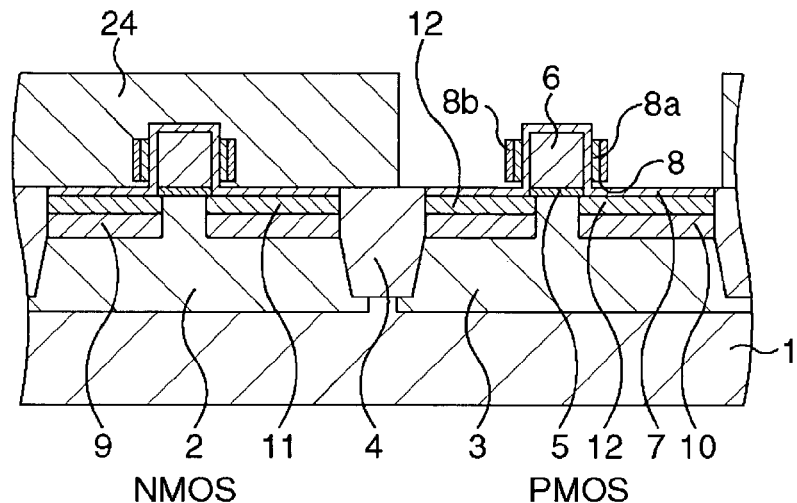
FIGS. 4A through 4C are schematic sectional views, as continued from FIG. 3C, serially showing process steps of the method of manufacturing the semiconductor device according to the first embodiment of the present invention.

Next as shown in FIG. 4A, a resist film 24 is formed on the semiconductor substrate 1 so as to cover the NMOS area and to expose the PMOS area. Using the resist film 24, gate electrode 6, silicon oxide film 8a and silicon nitride film 8b together as a mask, a P-type impurity, which is typically boron, is ion-implanted to thereby form P-type extension layers 12 in the surficial portions of the pocket layers 10. The ion implantation is effected typically from the direction normal to the surface of the semiconductor substrate 1, where an implantation energy is typically set to 0.2 to 0.4 keV and an amount of dose is set to $1.0 \times 10^{15}$ to $1.5 \times 10^{15}$ cm$^{-2}$. The resist film 24 is removed after the ion implantation.

Figure 4B:
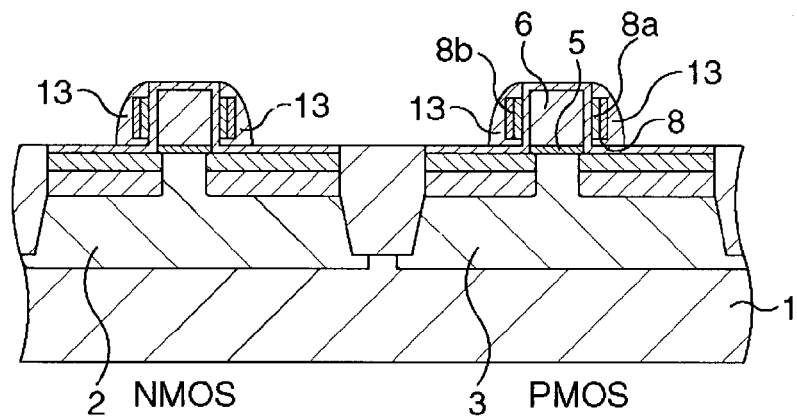

An insulating film, which is typically a silicon oxide film, is formed over the entire surface, and the film is then anisotropically etched so as to leave a portion of such film only on the side portions of the gate electrodes 6, to thereby form side walls 13 as shown in FIG. 4B. The silicon oxide film 8a and silicon nitride film 8b are buried for example in the side walls 13.

Figure 4C:
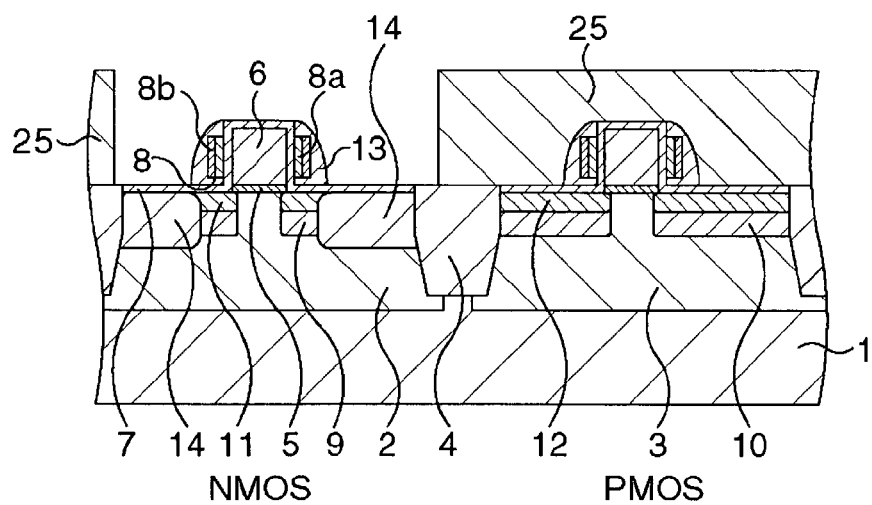

Next as shown in FIG. 4C, a resist film 25 is formed on the semiconductor substrate 1 so as to cover the PMOS area and to expose the NMOS area. Using the resist film 25, gate electrode 6 and side walls 13 together as a mask, an N-type impurity, which is typically phosphorus, is ion-implanted at a high concentration to thereby form deep N-type source/drain diffusion regions 14 in the surficial portion of the P-well 2. The ion implantation is carried out typically from the direction normal to the surface of the semiconductor substrate 1, where an implantation energy is set to 5 to 9 keV and an amount of dose is set to $5 \times 10^{15}$ to $8 \times 10^{15}$ cm$^{-2}$. The resist film 25 is removed after the ion implantation.

Figure 5A:
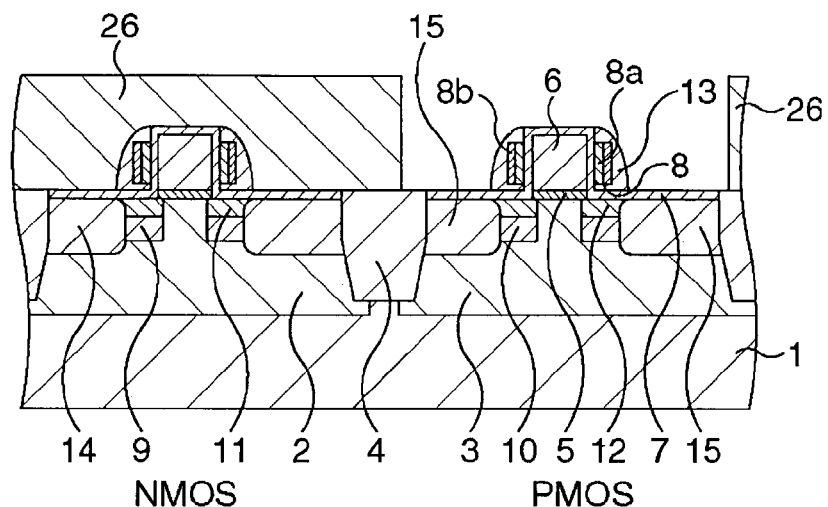
FIGS. 5A through 5C are schematic sectional views, as continued from FIG. 4C, serially showing process steps of the method of manufacturing the semiconductor device according to the first embodiment of the present invention.

Next as shown in FIG. 5A, a resist film 26 is formed on the semiconductor substrate 1 so as to cover the NMOS area and to expose the PMOS area. Using the resist film 26, gate electrode 6 and side walls 13 together as a mask, a P-type impurity, which is typically boron, is ion-implanted at a high concentration to thereby form deep P-type source/drain diffusion regions 15 in the surficial portion of the N-well 3. The ion implantation is carried out typically from the direction normal to the surface of the semiconductor substrate 1, where an implantation energy is typically set to 2 to 5 keV and an amount of dose is set to $3 \times 10^{15}$ to $5 \times 10^{15}$ cm$^{-2}$. The resist film 26 is removed after the ion implantation, and then annealing is carried out so as to activate the implanted impurity. It is also allowable to carry out the annealing by spike annealing under an $N_2$ atmosphere at 1,025 to 1,070° C.

Figure 5B:
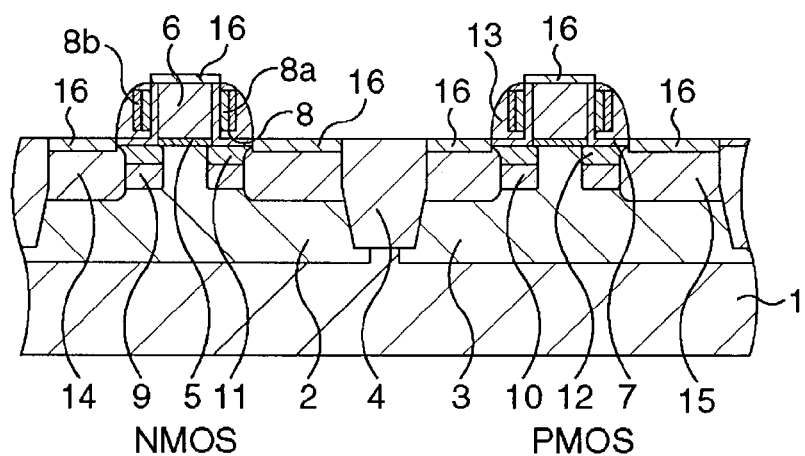

Then as shown in FIG. 5B, an exposed portion of the silicon nitride film 7 is removed, and a silicide layer 16, which is typically a cobalt silicide layer, is formed on the gate electrode 6 and source/drain diffusion layers 14, 15.

The process then advances to formation of an interlayer insulating film 17, formation of contact holes 18 which penetrate the interlayer insulating film 17 to reach the source/drain diffusion regions 14, 15, filling of the contact holes 18 with a conductive material 19, and formation of a wiring, which completes a CMOS transistor.

Figure 5C:
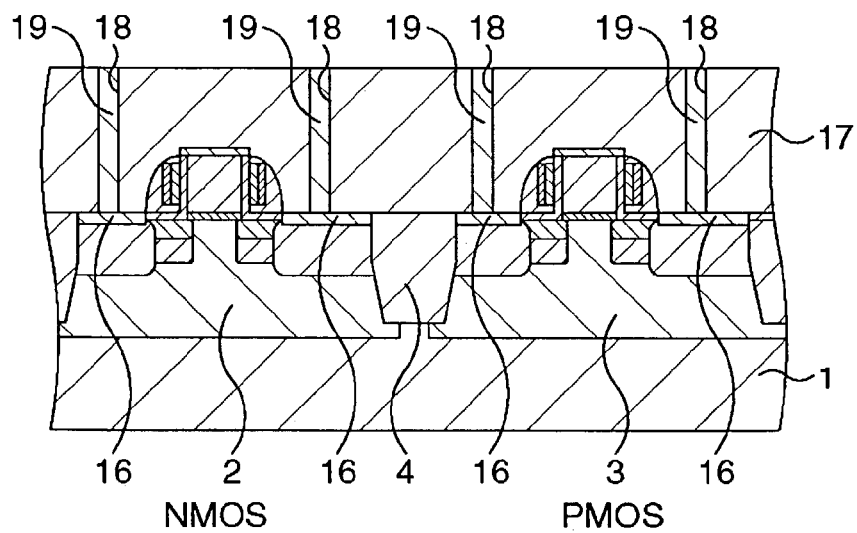

The semiconductor device thus manufactured has a constitution shown in FIG. 5C.

According to the first embodiment of the present invention, the silicon nitride layer 7 is formed at least on the side surfaces of the gate electrode 6 and on the surfaces of the P-well 2 and N-well 3 after the process step for forming the gate electrode 6 (FIG. 1B) and before the process step for annealing for activation of the impurities in the source/drain diffusion regions 14, 15, so that the outward diffusion of the impurities in the channel, and the outward diffusion of the impurities in the source/drain diffusion regions 14, 15 can successfully be suppressed even when the annealing is carried out. This is successful in suppressing depletion which has been a problem in the previous process.

While the foregoing process includes the steps for forming and removing the resist films each time the pocket layers, extension layers and source/drain diffusion layers are formed, the surfaces of the P-well 2 and N-well 3 (surface of the semiconductor substrate 1) are prevented from being oxidized during ashing or wet processing for removing the resist films since the silicon nitride film 7 is formed at least on the surface of the P-well 2 and N-well 3. This successfully prevents decrease in the impurities and changes in the concentration and profile. The extension layers is not deepened, which is advantageous in that ensuring shallow junction.

Another advantage resides in that the pocket layers are formed by the ion implantation effected from a direction inclined away from the surface of the semiconductor substrate 1 after the notches are formed 8, and that the extension layers are formed by the ion implantation effected from the direction normal to the surface of the semiconductor substrate 1, so that overlap in the plan view of the extension layers with the gate electrode can be suppressed to a narrow level while ensuring a wide overlap of the pocket layers with the gate electrode.

Figure 6A:
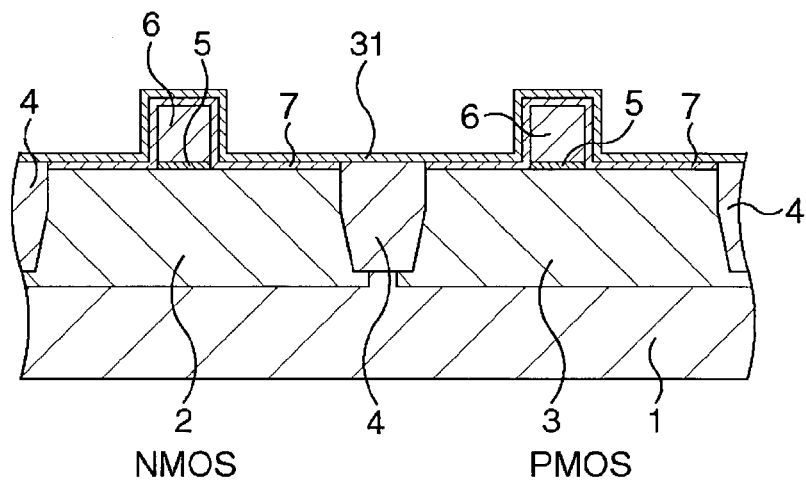
FIGS. 6A through 6C are schematic sectional views serially showing process steps of a method of manufacturing a semiconductor device according to a second embodiment of the present invention.
Figure 6B:
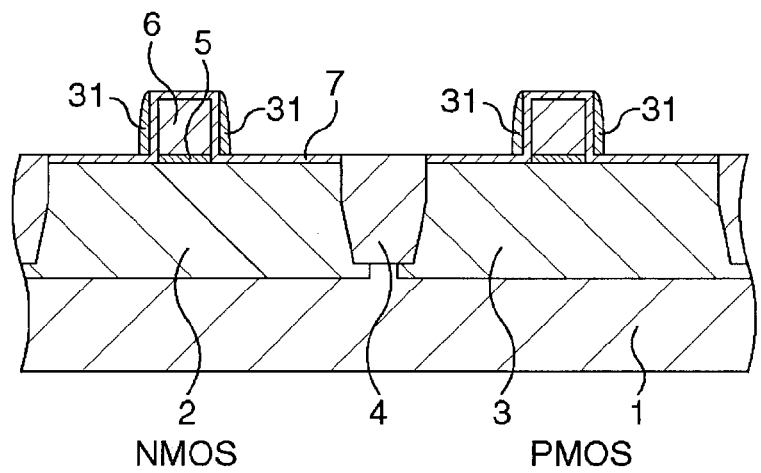
Figure 6C:
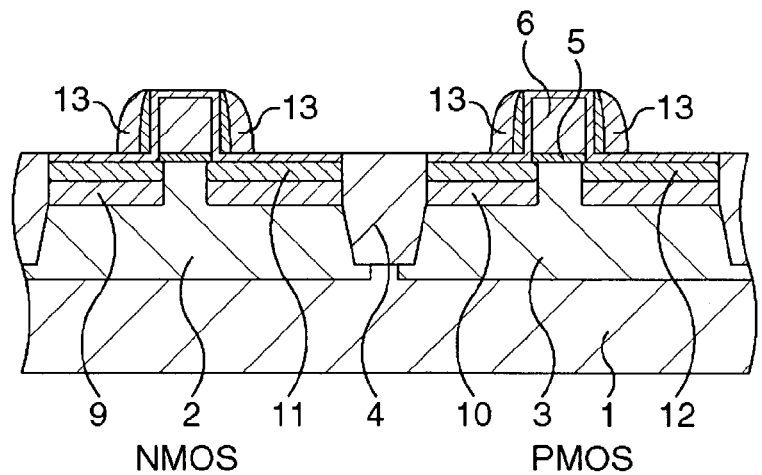
Figure 7:
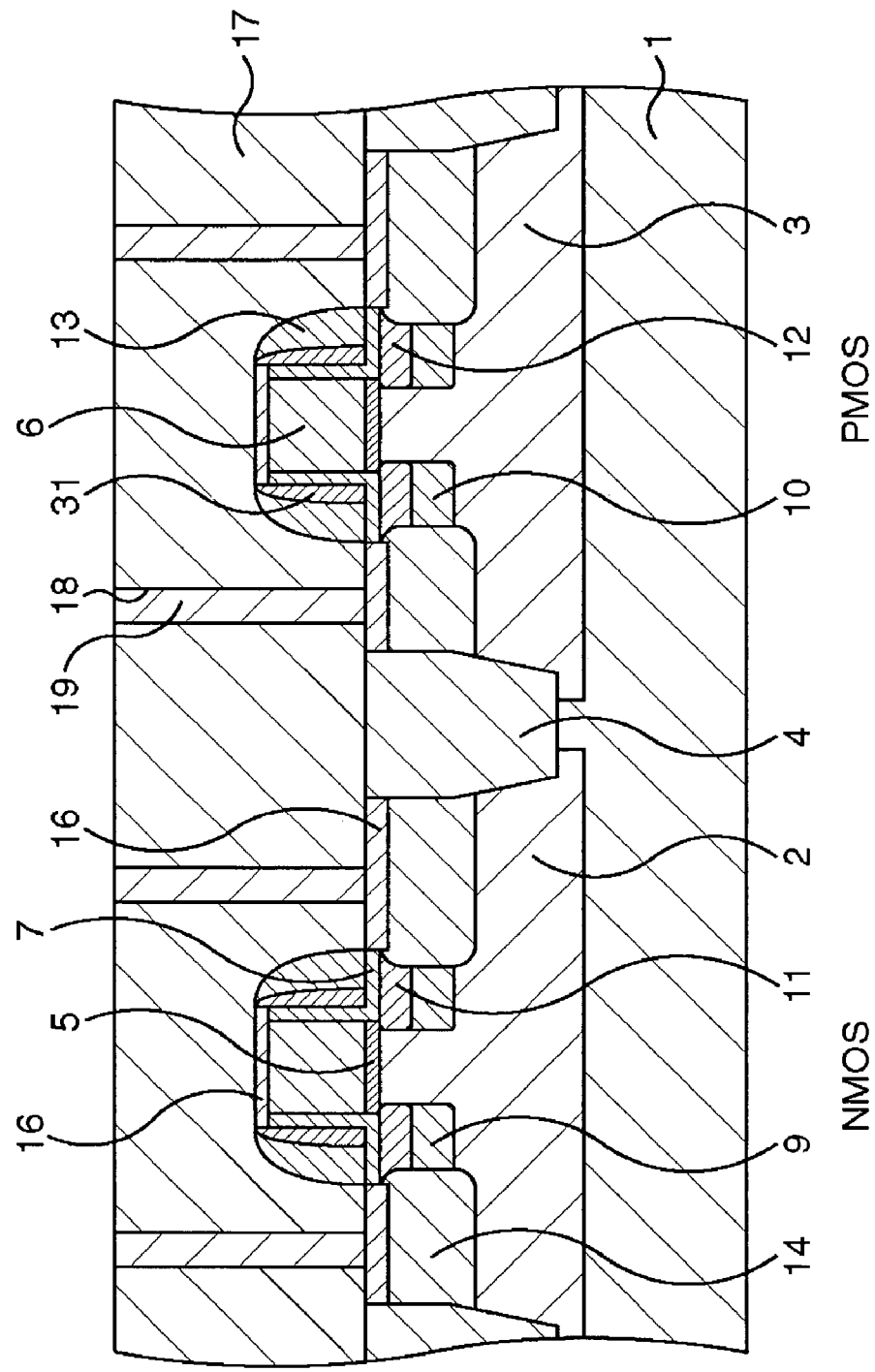
FIG. 7 is a schematic sectional view showing a CMOS transistor manufactured by the second embodiment of the present invention.

Next paragraphs will deal with the second embodiment of the present invention. In the second embodiment, a double sidewall structure is applied to a CMOS transistor. FIGS. 6A through 6C are schematic sectional views serially showing process steps of a method of manufacturing a semiconductor device according to the second embodiment of the present invention, and FIG. 7 is a schematic sectional view showing a CMOS transistor manufactured by the second embodiment of the present invention.

In the second embodiment, the process steps from formation of the element isolation region 4 (FIG. 1A) to formation of the silicon nitride layer 7 (FIG. 1C) are carried out similarly to those in the first embodiment.

Next as shown in FIG. 6A, a silicon oxide film 31 is formed over the entire surface.

Next as shown in FIG. 6B, the silicon oxide film 31 is anisotropically etched so as to leave a portion thereof only on the side portions of the gate electrodes 6.

The process steps from formation of the resist film 21 (FIG. 3A) to formation of the extension layers 12 (FIG. 4A) are then carried out similarly to those in the first embodiment.

An insulating film, which is typically a silicon oxide film, is then formed on the entire surface, and the film is then anisotropically etched so as to leave a portion thereof only on the side portions of the gate electrodes 6, to thereby form side walls 13 as shown in FIG. 6C. The silicon oxide film 31 is covered for example with the side walls 13.

The process steps from formation of the resist film 25 (FIG. 4C) and thereafter are then carried out similarly to those in the first embodiment, which completes a CMOS transistor shown in FIG. 7.

The effects of preventing outward diffusion and oxidation of the semiconductor substrate 1 during the removal of the resist films can be obtained also in the second embodiment similarly to the first embodiment.

Next paragraphs will deal with the third embodiment of the present invention. In the third embodiment, a structure having a notched gate electrode is applied to a CMOS transistor. FIGS. 8A through 9C are schematic sectional views serially showing process steps of a method of manufacturing a semiconductor device according to the third embodiment of the present invention, and FIG. 10 is a schematic sectional view showing a CMOS transistor manufactured by the third embodiment of the present invention.

In the third embodiment, the element isolation region 4, P-well 2 and N-well 3 are formed (FIG. 1A) similarly to the first embodiment.

Figure 8A:
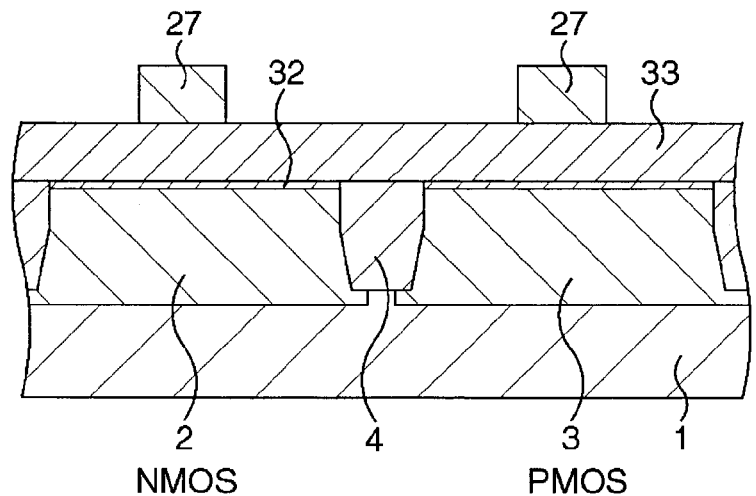
FIGS. 8A through 8C are schematic sectional views serially showing process steps of a method of manufacturing a semiconductor device according to a third embodiment of the present invention.
Figure 9A:
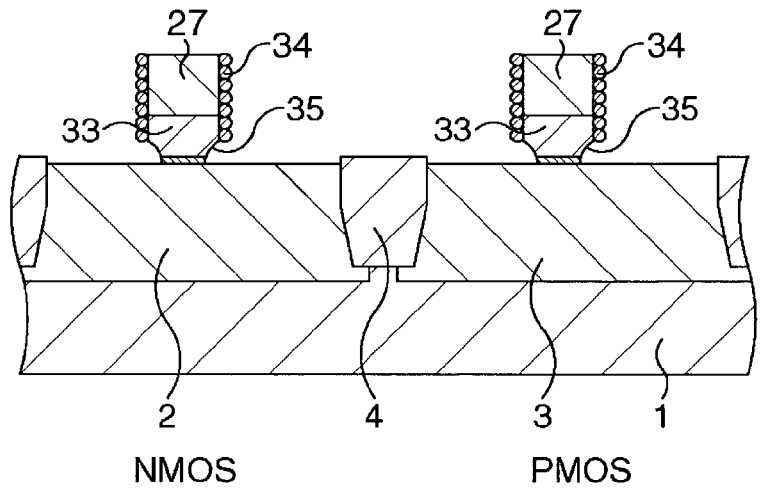
FIGS. 9A through 9C are schematic sectional views, as continued from FIG. 8C, serially showing process steps of the method of manufacturing the semiconductor device according to the third embodiment of the present invention.

Next as shown in FIG. 8A, an insulating film 32 and a polysilicon film 33 are formed on the semiconductor substrate 1, and further on the polysilicon film 33 in the device forming areas, resist films 27 are formed so as to cover the areas where the gate electrodes are to be formed.

Figure 8B:
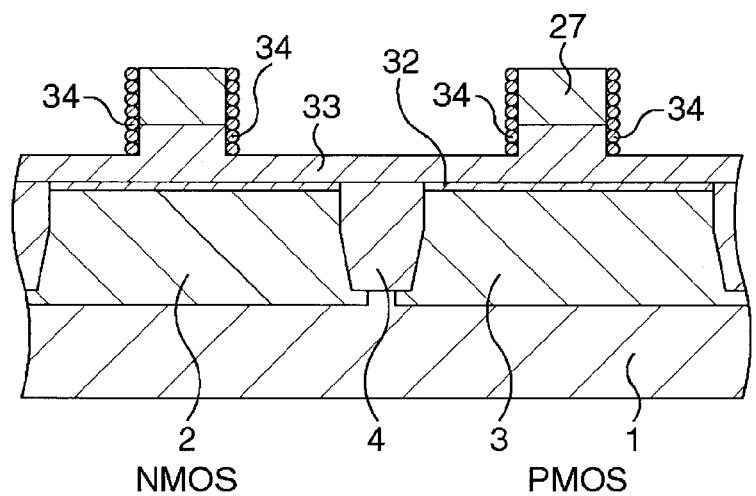
Figure 8C:
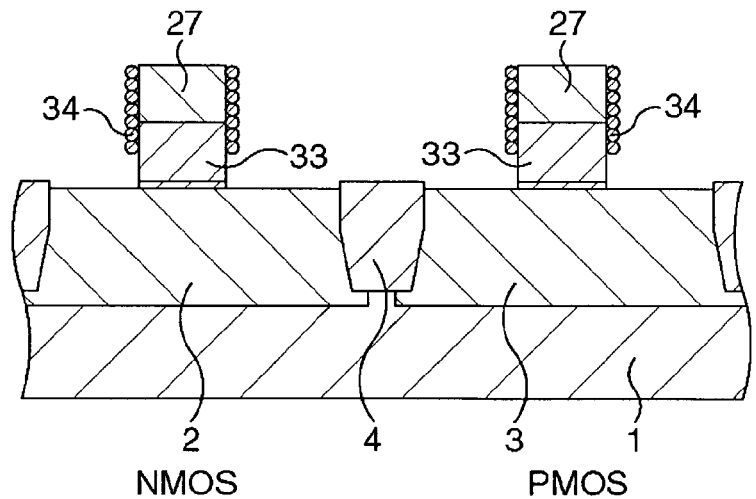

Next using the resist films 27 as a mask and using a gas containing HBr and $O_2$, the upper portion of the polysilicon film 33 is etched. The etching is carried out under a condition which allows the depositional matter generated in the etching to readily adhere on the side planes of the upper portion of the polysilicon film 33 which emerge as the etching proceeds. When the etching completes, a deposit 34 remains as shown in FIG. 8B.

The lower portion of the polysilicon film 33 is then etched using the resist film 27 as a mask. The etching is carried out under a condition which makes it difficult for the depositional matter generated in the etching to adhere on the side planes of the lower portion of the polysilicon film 33 which emerge as the etching proceeds. When the etching completes, a deposit 34 remains on the upper side planes of the etched polysilicon film 33 and side planes of the resist film 27.

The polysilicon film 33 is then isotropically etched using the resist film 27 as a mask. In the isotropic etching, the upper portion of the polysilicon film 33 is hardly removed by virtue of protection by the thick deposit 34, but the etching of the lower portion of the polysilicon film 33 can proceed since the portion has only a slight amount of deposit 34 adhered thereon which can readily be removed. When the etching completes, tapered notches 35 are formed along the edges of the gate insulating film 5 and the bottom ends of the gate electrode 6 as shown in FIG. 9A. The gate electrode 6 thus obtained comprises the residual portion of the polysilicon film 33 and deposit 34.

Figure 9B:
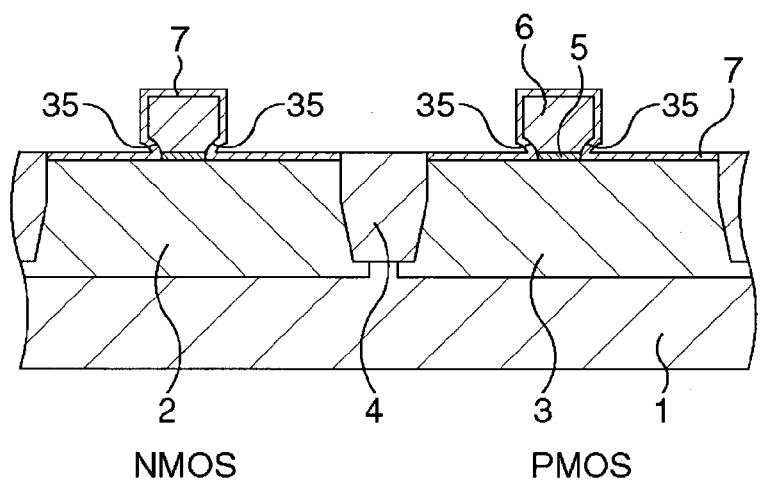
Figure 10:
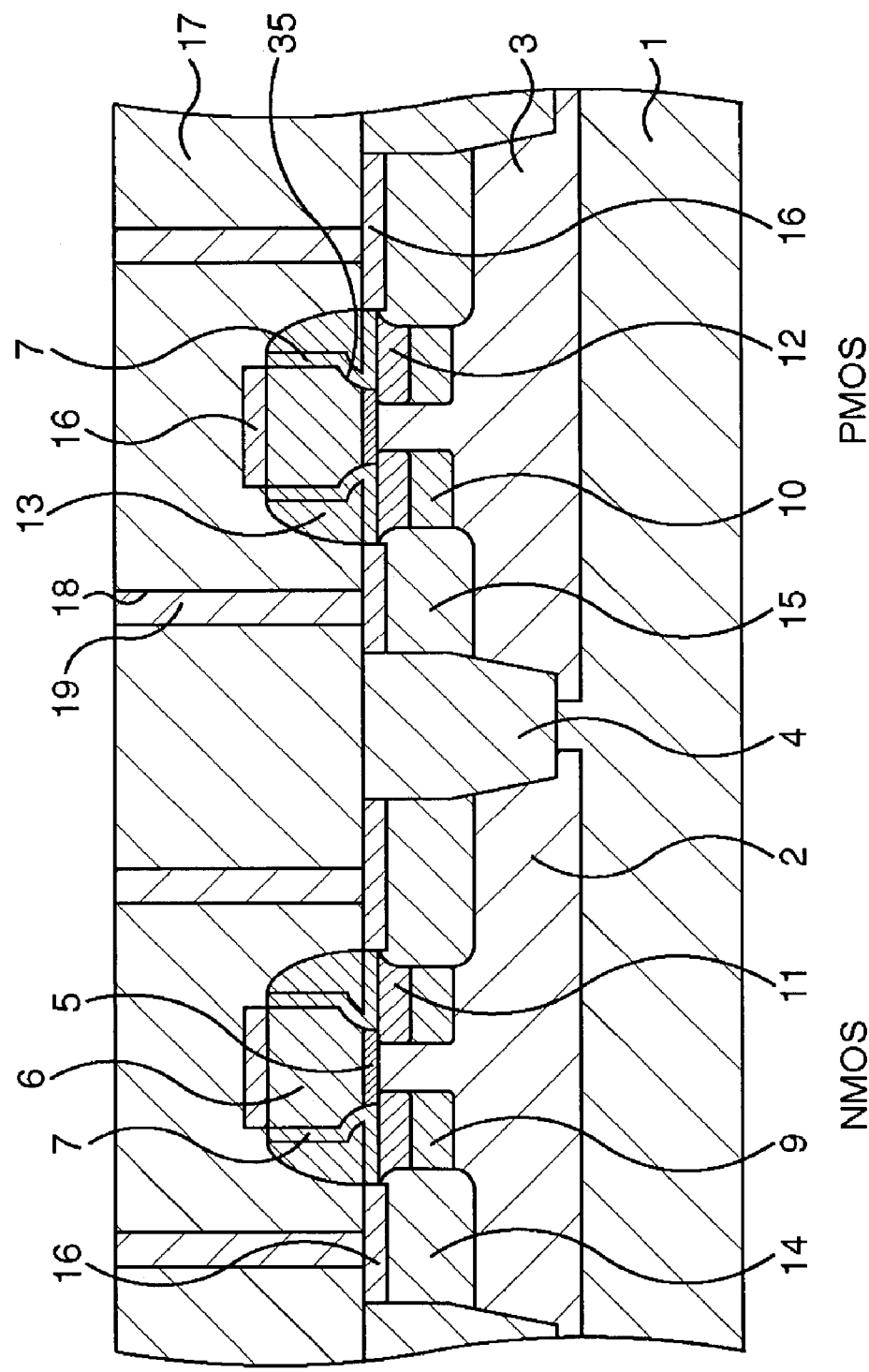
FIG. 10 is a schematic sectional view showing a CMOS transistor manufactured by the third embodiment of the present invention.

Next a silicon nitride film 7 having a thickness of 3 nm or less is formed on the surface of the P-well 2 and N-well 3, on the upper and side surfaces of the gate electrode 6, and on the side surfaces of the notches 35 as shown in FIG. 9B. The silicon nitride film 7 can be formed similarly to the first embodiment.

The process steps from formation of the resist film 21 (FIG. 3A) to formation of the extension layers 12 (FIG. 4A) are carried out similarly to those in the first embodiment.

Figure 9C:
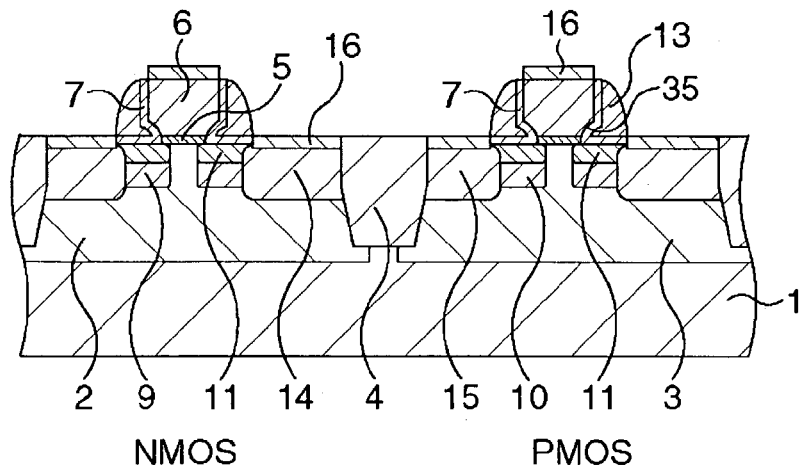

An insulating film, which is typically a silicon oxide film, is formed over the entire surface, and the film is then anisotropically etched so as to leave a portion thereof only on the side portions of the gate electrodes 6, to thereby form side walls 13 as shown in FIG. 9C.

The process steps from formation of the resist film 25 (FIG. 4C) and thereafter are carried out similarly to those in the first embodiment, which completes a CMOS transistor shown in FIG. 10.

The effects of preventing outward diffusion and oxidation of the semiconductor substrate 1 during the removal of the resist films can be obtained also in the third embodiment similarly to the first embodiment.

Figure 11:
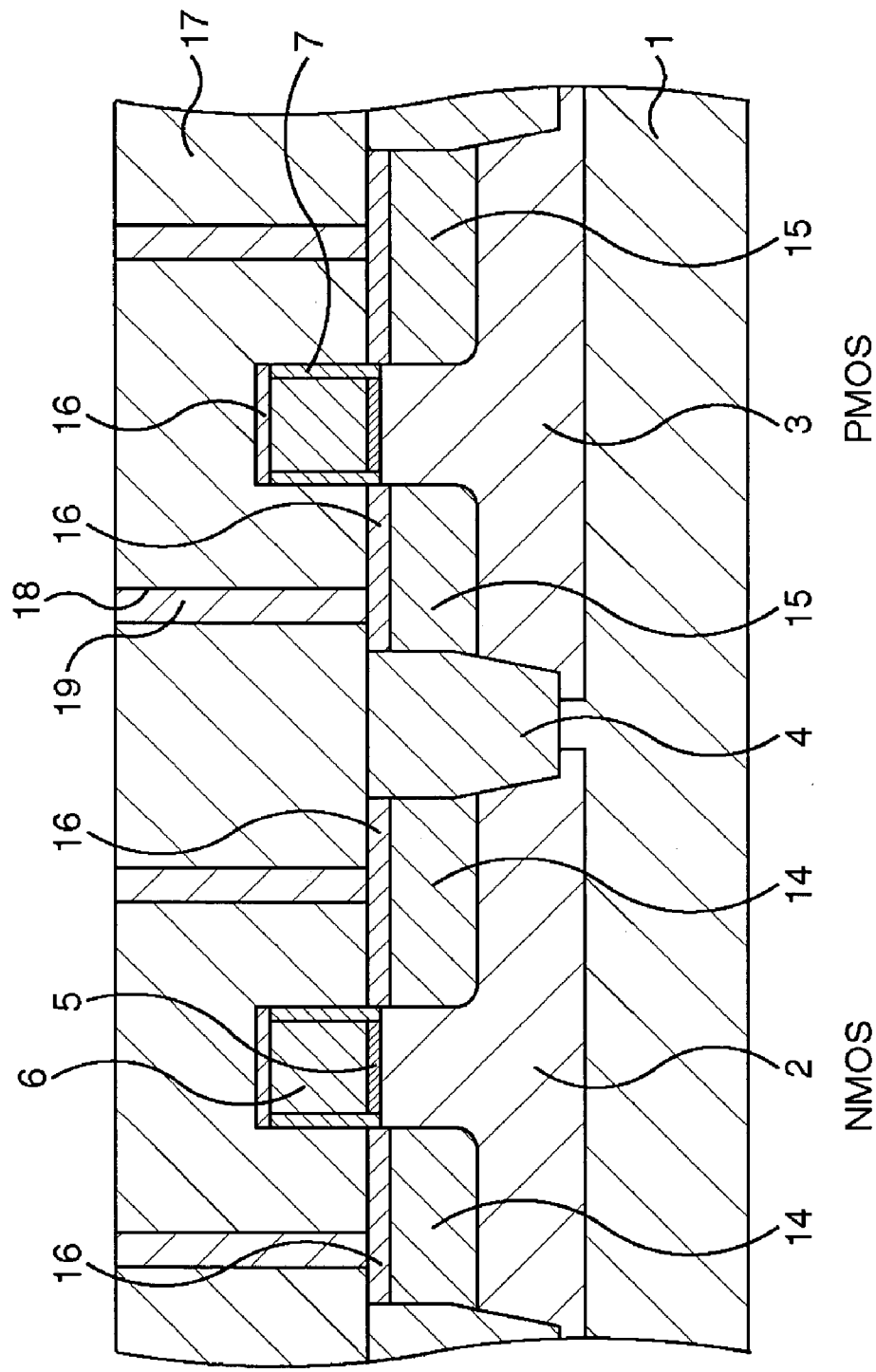
FIG. 11 is a schematic sectional view showing a CMOS transistor manufactured by a fourth embodiment of the present invention.

Next paragraphs will deal with the fourth embodiment of the present invention. In the fourth embodiment, a so-called, single-drain structure is applied to a CMOS transistor. FIG. 11 is a schematic sectional view showing a CMOS transistor manufactured by the fourth embodiment of the present invention.

The CMOS transistor shown in FIG. 11 has neither the pocket layers nor extension layers in any of the source/drain regions of the N-channel transistor and P-channel transistor, unlike the CMOS transistor previously shown in FIG. 5C. Also the side walls 13 are not formed.

The CMOS transistor having such constitution can be manufactured by the process steps previously shown in FIGS. 1A through FIG. 5C, except that the process steps for forming the pocket layers or extension layers, and associate process steps for forming and removing the masks are omitted. It is to be noted now that the process step for forming the silicon nitride layer 7 shown in FIG. 1C is, of course, an indispensable step.

The effects of preventing outward diffusion and oxidation of the semiconductor substrate 1 during the removal of the resist films can be obtained also in the fourth embodiment similarly to the first embodiment.

Figure 12A:
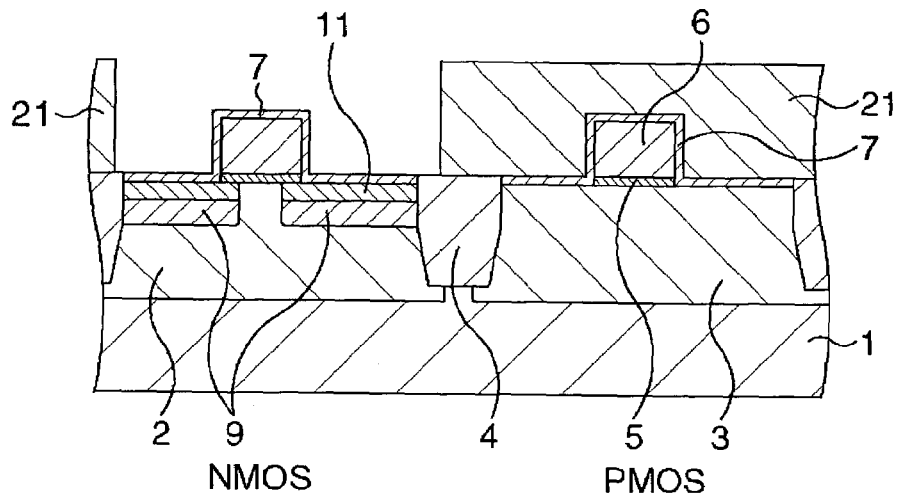
FIGS. 12A through 12C are schematic sectional views serially showing process steps of a method of manufacturing a semiconductor device according to a fifth embodiment of the present invention.
Figure 12B:
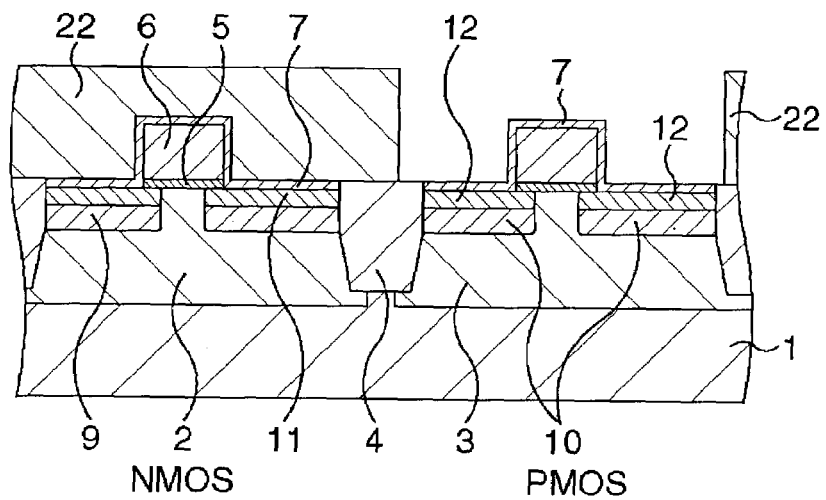
Figure 12C:
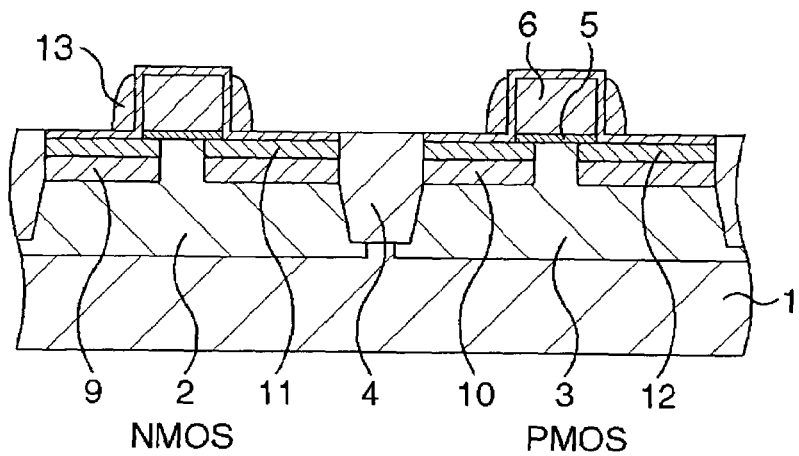
Figure 13:
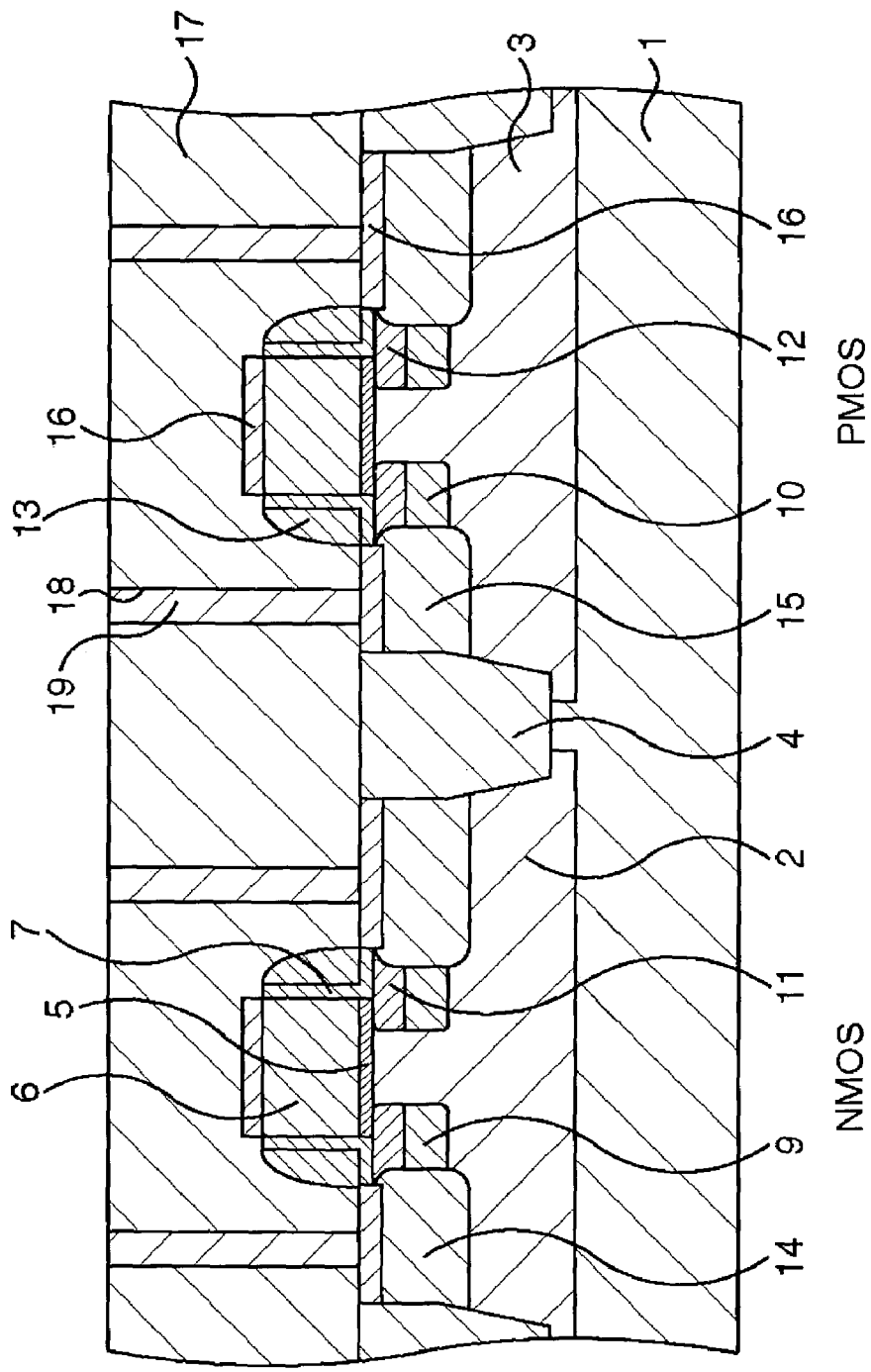
FIG. 13 is a schematic sectional view showing a CMOS transistor manufactured by the fifth embodiment of the present invention.

Next paragraphs will deal with the fifth embodiment of the present invention. In the fifth embodiment, a structure having neither notches 8 nor notches 32 is applied to a CMOS transistor. FIGS. 12A through 12C are schematic sectional views serially showing process steps of a method of manufacturing a semiconductor device according to the fifth embodiment of the present invention, and FIG. 13 is a schematic sectional view showing a CMOS transistor manufactured by the fifth embodiment of the present invention.

In the fifth embodiment, the process steps from formation of the element isolation region 4 (FIG. 1A) to formation of the silicon nitride film 7 (FIG. 1C) are carried out similarly to those in the first embodiment.

Next as shown in FIG. 12A, the resist film 21 is formed while omitting the preceding steps shown in FIGS. 2A through 2C. Using the resist film 21 and gate electrode 6 together as a mask, the P-type pocket layers 9 and N-type extension layers 11 are formed.

Next as shown in FIG. 12B, the resist film 21 is removed, and then the resist film 22 is formed. Using the resist film 22 and gate electrode 6 together as a mask, the N-type pocket layers 10 and P-type extension layers 12 are formed.

The resist film 22 is then removed, and the process steps from formation of the side walls 13 (FIG. 4B) and thereafter are carried out similarly to those in the first embodiment, which completes a CMOS transistor shown in FIG. 13.

The effects of preventing outward diffusion and oxidation of the semiconductor substrate 1 during the removal of the resist films can be obtained also in the fifth embodiment similarly to the first embodiment.

Figure 14:
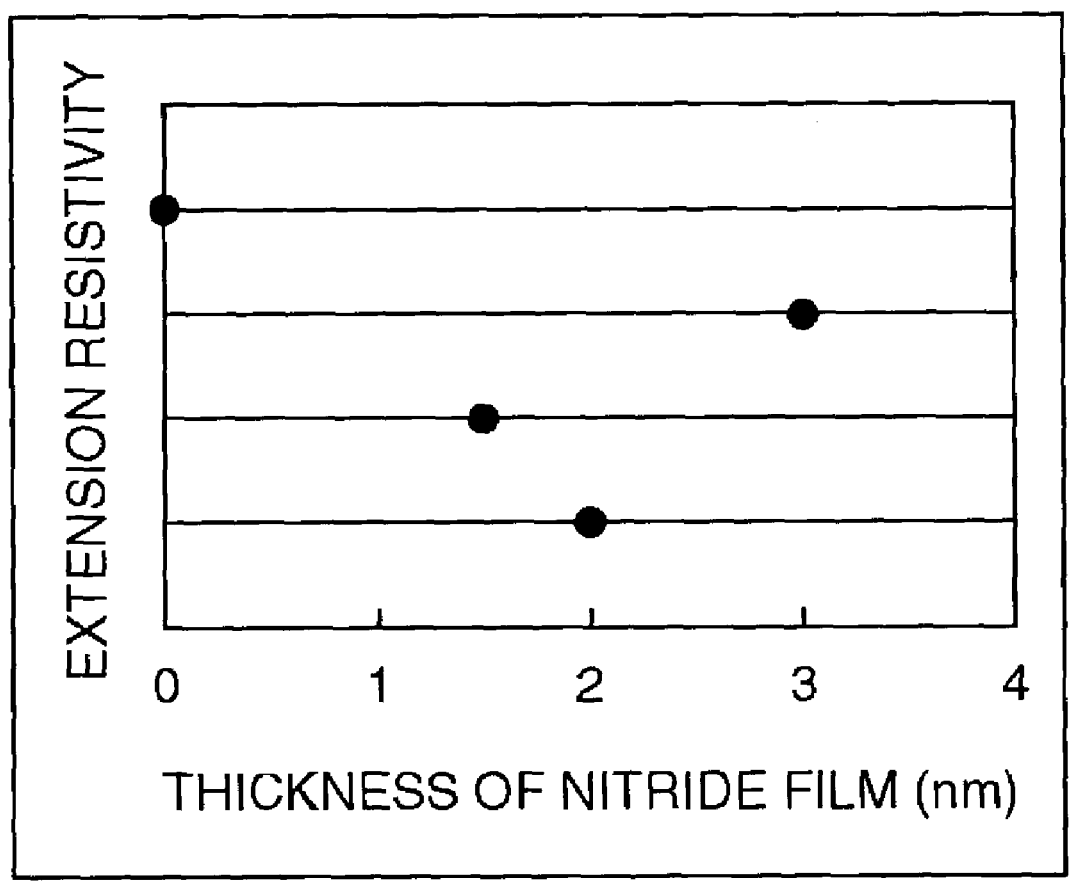
FIG. 14 is a graph showing relation between the thickness of the nitride film and resistivity of the extension layer (extension resistivity)
Figure 15A:
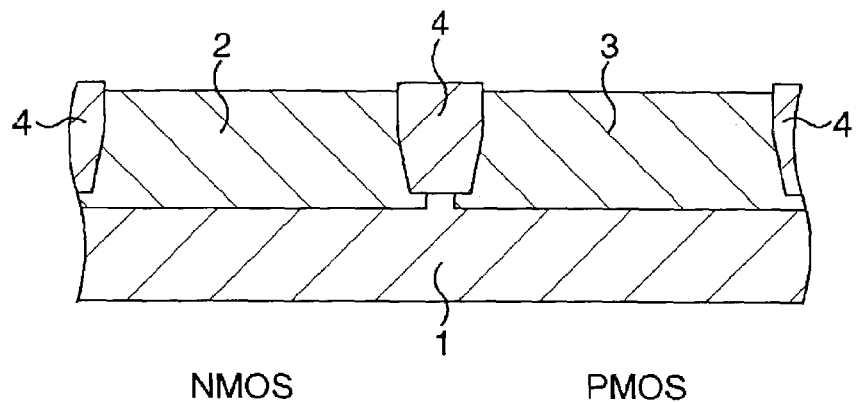
FIGS. 15A through 15C are schematic sectional views serially showing process steps of a conventional method of manufacturing a semiconductor device.
Figure 15B:
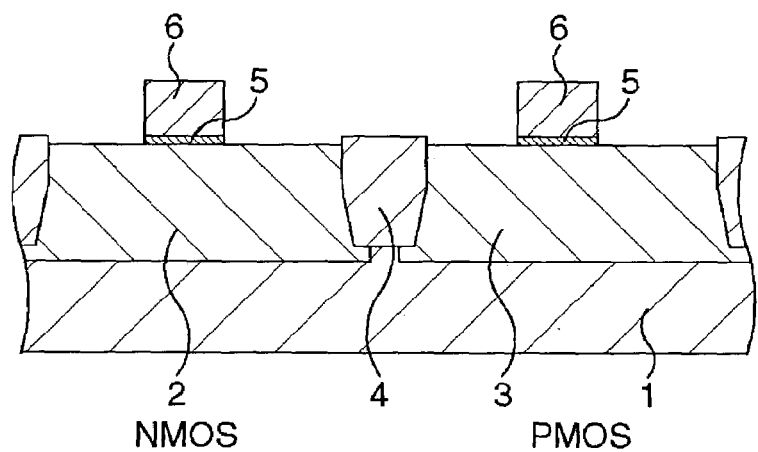
Figure 15C:
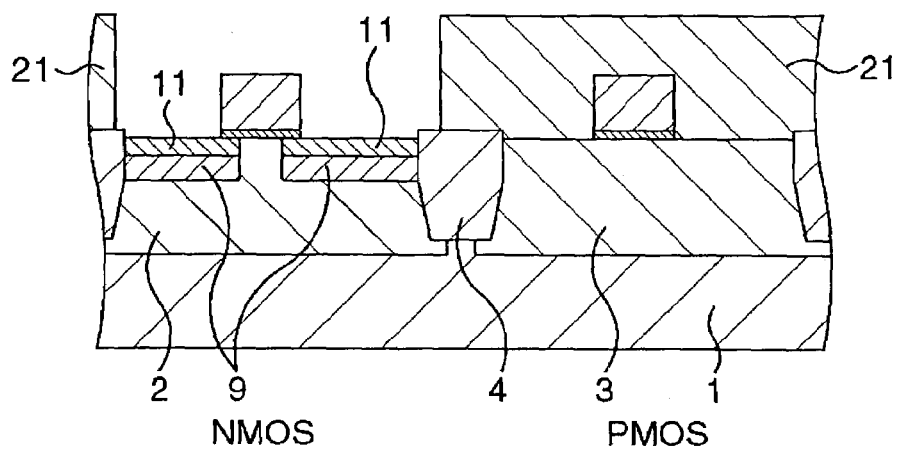
Figure 16A:
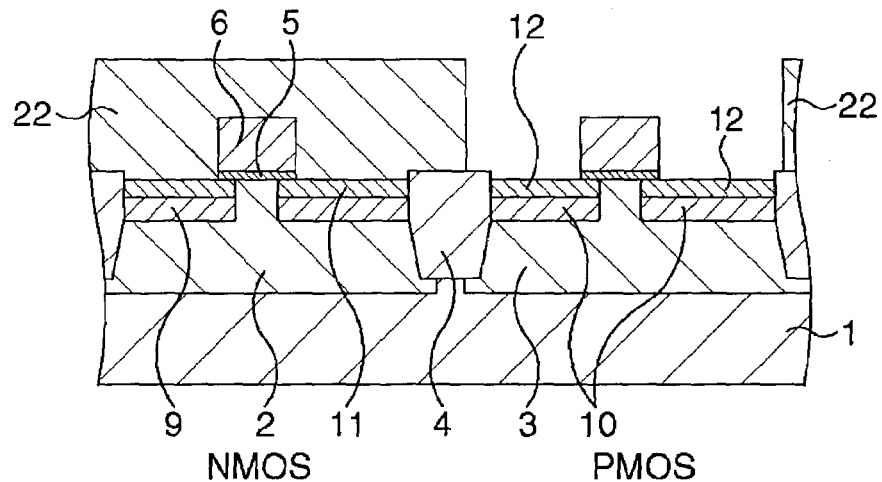
FIGS. 16A through 16C are schematic sectional views, as continued from FIG. 15C, serially showing process steps of the conventional method of manufacturing the semiconductor device.
Figure 16B:
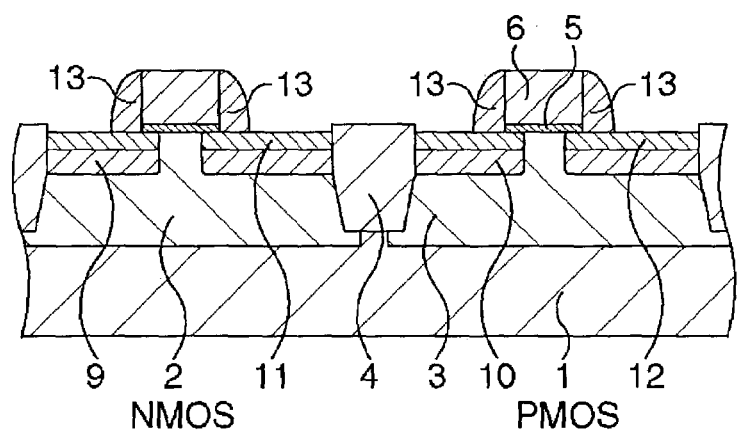
Figure 16C:
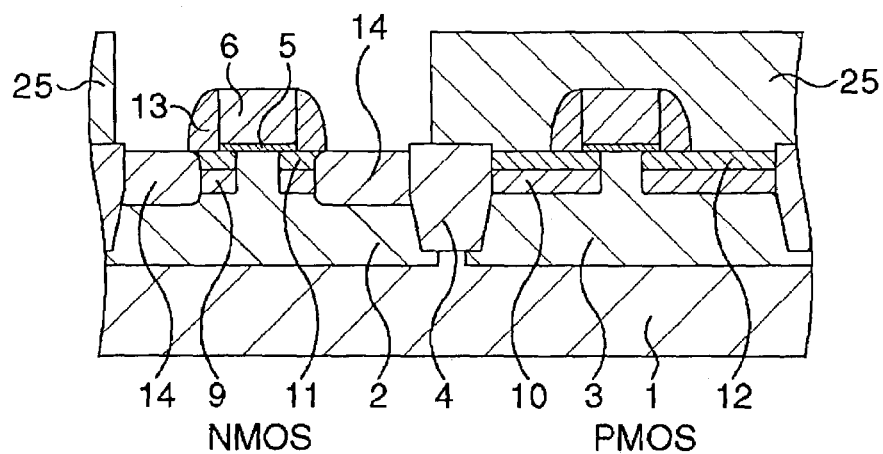
Figure 17A:
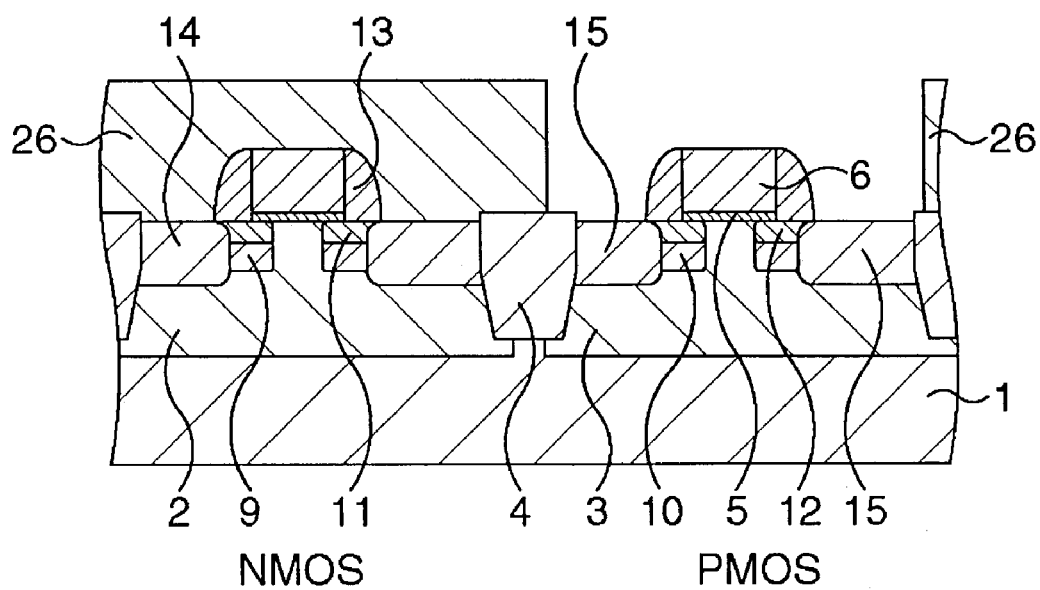
FIGS. 17A and 17B are schematic sectional views, as continued from FIG. 16C, serially showing process steps of the conventional method of manufacturing the semiconductor device.
Figure 17B:
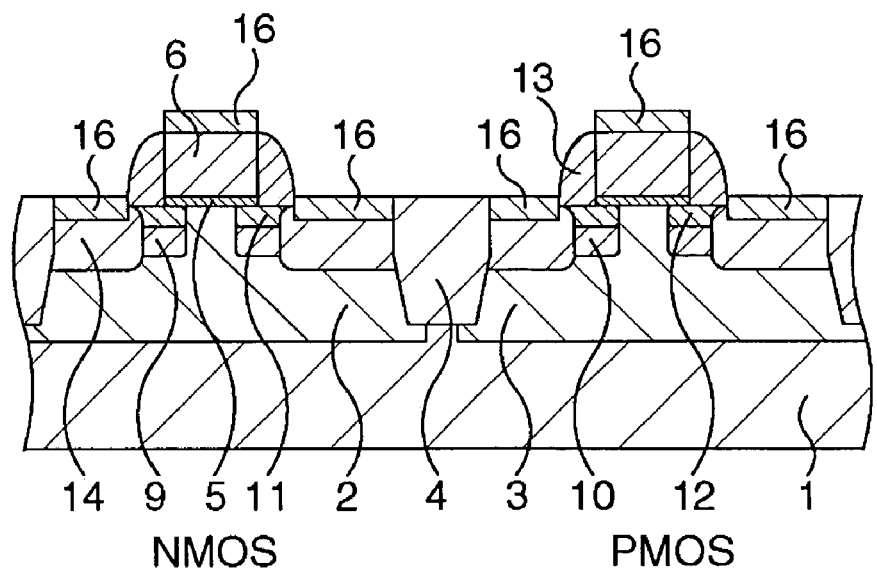

In the present invention, the thickness of the nitride film is preferably 3 nm or less, and more preferably 2 nm or less. FIG. 14 is a graph showing relation between the thickness of the nitride film and resistivity of the extension layer (extension resistivity). As is clear from FIG. 14, the nitride film having a proper thickness can lower the resistivity of the extension layer, but too large thickness thereof tends to undesirably raise the resistivity of the extension layer. The nitride film has thus preferably has a thickness of 3 nm or less.

The CMOS transistors explained in the foregoing embodiments are applicable to inverter or so. It is to be noted now that the semiconductor device according to the present invention is by no means limited to those applied to the CMOS transistors.

While the ion implantation in the foregoing embodiments are carried out using the resist films as a mask, the present invention is also valid for the case where a stencil mask is used. The reason why resides in that it is no more necessary to carry out a step for removing the resist film for the case where the stencil mask is used, but the conventional method suffers from probability of depletion of the channel during the annealing.

What is claimed is:

1. A method of manufacturing a semiconductor device comprising the steps of:
    forming, on a semiconductor substrate having a first conductivity type, a gate insulating film which comprises a material having a dielectric constant higher than that of a silicon oxide film;
    forming a gate electrode on said gate insulating film;
    introducing nitrogen into the surfaces of said semiconductor substrate and said gate electrode, thereby forming a silicon nitride layer; and
    forming a pair of impurity layers through said silicon nitride layer, said impurity layers having the opposite conductivity type from said first conductivity type, which are formed in said semiconductor substrate to fall on both sides of the gate electrode
    further comprising a step, which comes next to said step for introducing nitrogen, for forming side walls on the side surfaces of said gate electrode while placing a nitrogen-containing layer formed in said step for introducing nitrogen in between; wherein said sidewalls are etched to form a notch along the side of said gate electrode.

2. The method of manufacturing a semiconductor device according to claim 1, wherein said step for introducing nitrogen further comprises a sub-step for exposing a target area to be introduced with nitrogen to a nitrogen-containing gas plasma or radical.

3. The method of manufacturing a semiconductor device according to claim 1, further comprising a step, which comes next to said step for introducing nitrogen, for forming a pair of first-conductivity-type impurity layers in said semiconductor substrate to fall on both sides of the gate electrode.

4. The method of manufacturing a semiconductor device according to claim 1, wherein a thickness of the nitrogen-containing layer formed in said step for introducing nitrogen is 3 nm or less.

5. The method of manufacturing a semiconductor device according to claim 1, wherein said gate insulating film is comprised of a silicon oxynitride film.

6. The method of manufacturing a semiconductor device according to claim 1, further comprising a step for forming a silicide layer on the surface of said impurity layer.

7. A method of manufacturing a semiconductor device comprising the steps of:
    forming a first-conductivity-type region and an opposite-conductivity-type region having a conductivity opposite from said first conductivity type in a semiconductor substrate having a first conductivity type;
    forming on said first-conductivity-type region a first gate insulating film which comprises a material having a dielectric constant larger than that of a silicon oxide film;
    forming on said opposite-conductivity-type region a second gate insulating film;

forming a first gate electrode on said first gate insulating film;
forming a second gate electrode on said second gate insulating film;
introducing nitrogen into the surface of said first and second gate electrodes, thereby forming a silicon nitride layer;
forming a first mask layer selectively covering said opposite-conductivity-type region;
forming a pair of impurity layers through said silicon nitride layer, said impurity layers having the opposite conductivity type in said semiconductor substrate to fall on both sides of said first gate electrode while using said first gate electrode and said first mask layer together as a mask;
removing said first mask layer;
forming a second mask layer selectively covering said first-conductivity-type region;
forming a pair of impurity layers through said silicon nitride layer, said impurity layers having the first conductivity type in said semiconductor substrate to fall on both sides of said second gate electrode while using said second gate electrode and said second mask layer together as a mask; and
removing said second mask layer
further comprising a step, which comes next to said step for introducing nitrogen, for forming side walls on the side surfaces of said first and second gate electrodes while placing a nitrogen-containing layer formed in said step for introducing nitrogen in between; wherein said sidewalls are etched to form a notch along the side of said gate electrode.

8. The method of manufacturing a semiconductor device according to claim 7, wherein said step for introducing nitrogen further comprises a sub-step for exposing a target area to be introduced with nitrogen to a nitrogen-containing gas plasma or radical.

9. The method of manufacturing a semiconductor device according to claim 7, further comprising steps, which come next to said step for introducing nitrogen, for forming a pair of said impurity layers having said first-conductivity-type in said semiconductor substrate to fall on both sides of said first gate electrode, and for forming a pair of said impurity layers having the opposite-conductivity-type in said semiconductor substrate to fall on both sides of said second gate electrode.

10. The method of manufacturing a semiconductor device according to claim 7, wherein a thickness of the nitrogen-containing layer formed in said step for introducing nitrogen is 3 nm or less.

11. The method of manufacturing a semiconductor device according to claim 7, wherein said first and second gate insulating films are comprised of a silicon oxynitride film.

12. The method of manufacturing a semiconductor device according to claim 7, further comprising a step for forming silicide layers on the surfaces of said pair of impurity layers having the first-conductivity-type and said pair of impurity layers having the opposite-conductivity-type.

13. A method for manufacturing a semiconductor device comprising the steps of:
forming a gate insulating film on a semiconductor substrate having a first conductivity type;
forming a gate electrode on said gate insulating film;
introducing nitrogen into the surface of said semiconductor substrate and said gate electrode by exposing them to a nitrogen-containing gas plasma or radical, thereby forming a silicon nitride layer; and
forming a pair of impurity layers through said silicon nitride layer, said impurity layers having the opposite conductivity from said first conductivity type in said substrate to fall on both sides of said gate electrode
further comprising a step, which comes next to said step for introducing nitrogen, for forming side walls on the side surfaces of said gate electrode while placing a nitrogen-containing layer formed in said step for introducing nitrogen in between; wherein said sidewalls are etched to form a notch along the side of said gate electrode.

14. The method of manufacturing a semiconductor device according to claim 13, further comprising a step, which comes next to said step for introducing nitrogen, for forming a pair of first-conductivity-type impurity layers in said semiconductor substrate to fall on both sides of the gate electrode.

15. The method of manufacturing a semiconductor device according to claim 13, wherein a thickness of the nitrogen-containing layer formed in said step for introducing nitrogen is 3 nm or less.

16. The method of manufacturing a semiconductor device according to claim 13, wherein said gate insulating film is comprised of a silicon oxinitride film.

17. The method of manufacturing a semiconductor device according to claim 13, further comprising a step for forming a silicide layer on the surface of said impurity layer.

* * * * *